United States Patent
Togami et al.

(10) Patent No.: US 8,093,710 B2
(45) Date of Patent: Jan. 10, 2012

(54) NON-UNIFORM FEEDTHROUGH AND LEAD CONFIGURATION FOR A TRANSISTOR OUTLINE PACKAGE

(75) Inventors: Chris Kiyoshi Togami, San Jose, CA (US); Darin J. Douma, Monrovia, CA (US)

(73) Assignee: Finisar Corporation, Sunnyvale, CA (US)

( * ) Notice: Subject to any disclaimer, the term of this patent is extended or adjusted under 35 U.S.C. 154(b) by 854 days.

(21) Appl. No.: 11/694,725

(22) Filed: Mar. 30, 2007

(65) Prior Publication Data
US 2008/0237835 A1    Oct. 2, 2008

(51) Int. Cl.
*H01L 23/52* (2006.01)
(52) U.S. Cl. .......... 257/698; 257/692; 257/693; 257/98; 257/99; 257/E23.141
(58) Field of Classification Search .................. 257/698, 257/E23.141, 692, 693, 98, 99
See application file for complete search history.

(56) References Cited

U.S. PATENT DOCUMENTS

| 5,904,555 A | 5/1999 | Darbha et al. |
| 2005/0045374 A1* | 3/2005 | Kumar et al. ............... 174/254 |
| 2005/0111503 A1* | 5/2005 | Ishigami et al. ............. 372/38.1 |
| 2006/0024005 A1* | 2/2006 | Ice et al. ......................... 385/92 |
| 2006/0165353 A1* | 7/2006 | Miao et al. ...................... 385/88 |

FOREIGN PATENT DOCUMENTS

| JP | 58-216449 | 12/1983 |
| JP | 14-324866 | 11/2002 |

* cited by examiner

Primary Examiner — Junghwa M Im
(74) Attorney, Agent, or Firm — Maschoff Gilmore & Israelsen

(57) ABSTRACT

A transistor outline package having a feedthrough via and lead configuration that maximizes the amount of usable area on a header of the package is disclosed. In one embodiment, the package includes a header having an interior surface that includes a first and second lead assembly. The first lead assembly includes two vias having a first diameter, with each first via being positioned along a first pin circle imaginarily defined on the interior surface of the header. Each first via also includes first leads received therein. The second lead assembly includes four vias having a second diameter each, with each second via being positioned along a second pin circle that has a diameter greater than that of the first pin circle. Each second via includes second leads received therein. This configuration increases usable area on the header interior surface between the leads, enabling relatively larger submounts to be placed thereon.

18 Claims, 5 Drawing Sheets

NON-UNIFORM FEEDTHROUGH AND LEAD CONFIGURATION FOR A TRANSISTOR OUTLINE PACKAGE

BACKGROUND

1. Technology Field

The present invention generally relates to optoelectronic packages. In particular, the present invention relates to a transistor outline package having a header feedthrough and lead configuration that maximizes usable surface on an interior surface of the header.

2. The Related Technology

Transistor outline packages ("TO packages") are used in many types of optical subassemblies, which in turn are employed in optical transceiver modules for transmitting and receiving data-encoded optical signals via a communications network.

TO packages typically include a header having a plurality of vias defined therethrough. A lead is passed through each via to enable electrical signals to pass through the header for use by a plurality of optoelectronic components disposed on a submount. The submount is mounted to an interior surface of the header.

Because of its relatively small size, the header interior surface provides only a small amount of surface area for placement of the submount and its optoelectronic components. With the ever-increasing demand for usable space for the placement of optoelectronic and other components, a relative increase in the size of the submount is considerably desirable.

In light of the above, a need exists in the art for a TO package and header design that maximizes the usable area on the header interior surface. Any solution to this need should preserve the ability to increase the size of a submount to be placed on the header interior surface. Moreover, any solution should not cause a corresponding compromise in other areas of header or TO package design.

BRIEF SUMMARY

The present invention has been developed in response to the above and other needs in the art. Briefly summarized, embodiments of the present invention are directed to a transistor outline package having a feedthrough via and lead configuration that maximizes the amount of usable area on a header of the package. In one embodiment, the package includes a header having an interior surface that includes a first and second lead assembly. The first lead assembly includes two vias having a first diameter, with each first via being positioned along a first pin circle imaginarily defined on the interior surface of the header. Each first via also includes first leads received therein. The second lead assembly includes four vias having a second diameter each, with each second via being positioned along a second pin circle that has a diameter greater than that of the first pin circle. Each second via includes second leads received therein. This configuration increases usable area on the header interior surface between the leads, enabling relatively larger submounts to be placed thereon.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-7 depict various features of embodiments of the present invention, which is generally directed to a transistor outline package having a feedthrough via and lead configuration that maximizes the amount of usable area on a header of the package. This maximized area enables a relatively larger submount to be placed thereon, which in turn frees up space on the submount for the inclusion of additional or larger optoelectronic components. Though described herein in connection with a transmitter optical subassembly having a laser diode for producing optical signals, embodiments of the present invention can be equally employed with optical subassemblies devoted to the reception of optical signals via the use of a photodetector.

Figure 1:
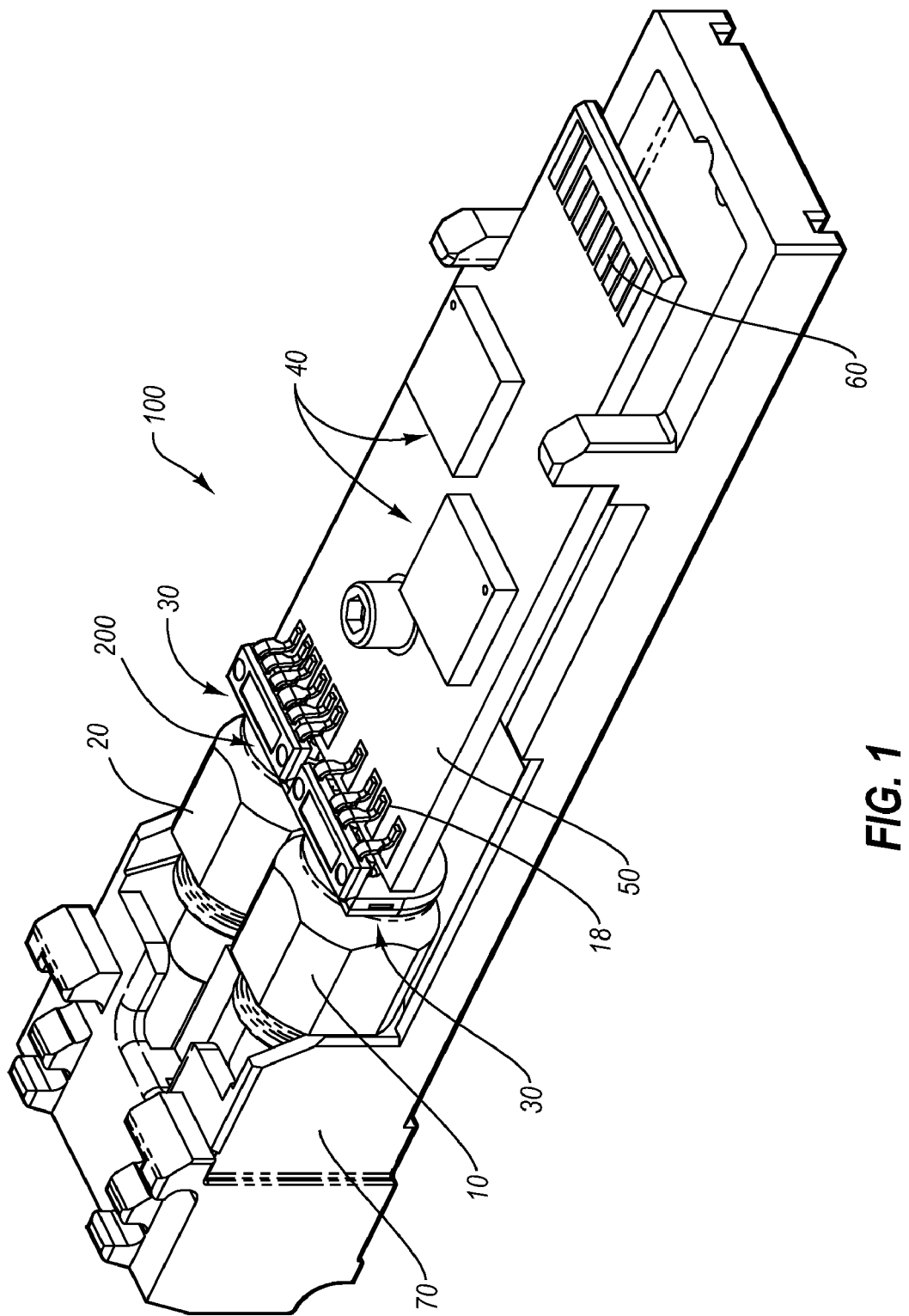
FIG. 1 is a perspective view of an optical transceiver module that includes a TO package configured in accordance with one embodiment of the present invention.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including an optical transmitter implemented as a transmitter optical subassembly ("TOSA") 10, an optical receiver implemented as a receiver optical subassembly ("ROSA") 20, electrical interfaces 30, various electronic components 40, and a printed circuit board 50.

In detail, two electrical interfaces 30 are included in the transceiver 100, one each used to electrically connect the TOSA 10 and the ROSA 20 to a plurality of conductive pads 18 located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the TOSA 10/ROSA 20, and the host. In addition, the above-mentioned components of the transceiver 100 are partially housed within a housing portion 70. Though not shown, a shell can cooperate with the housing portion 70 to define a covering for the components of the transceiver 100.

Figure 2:
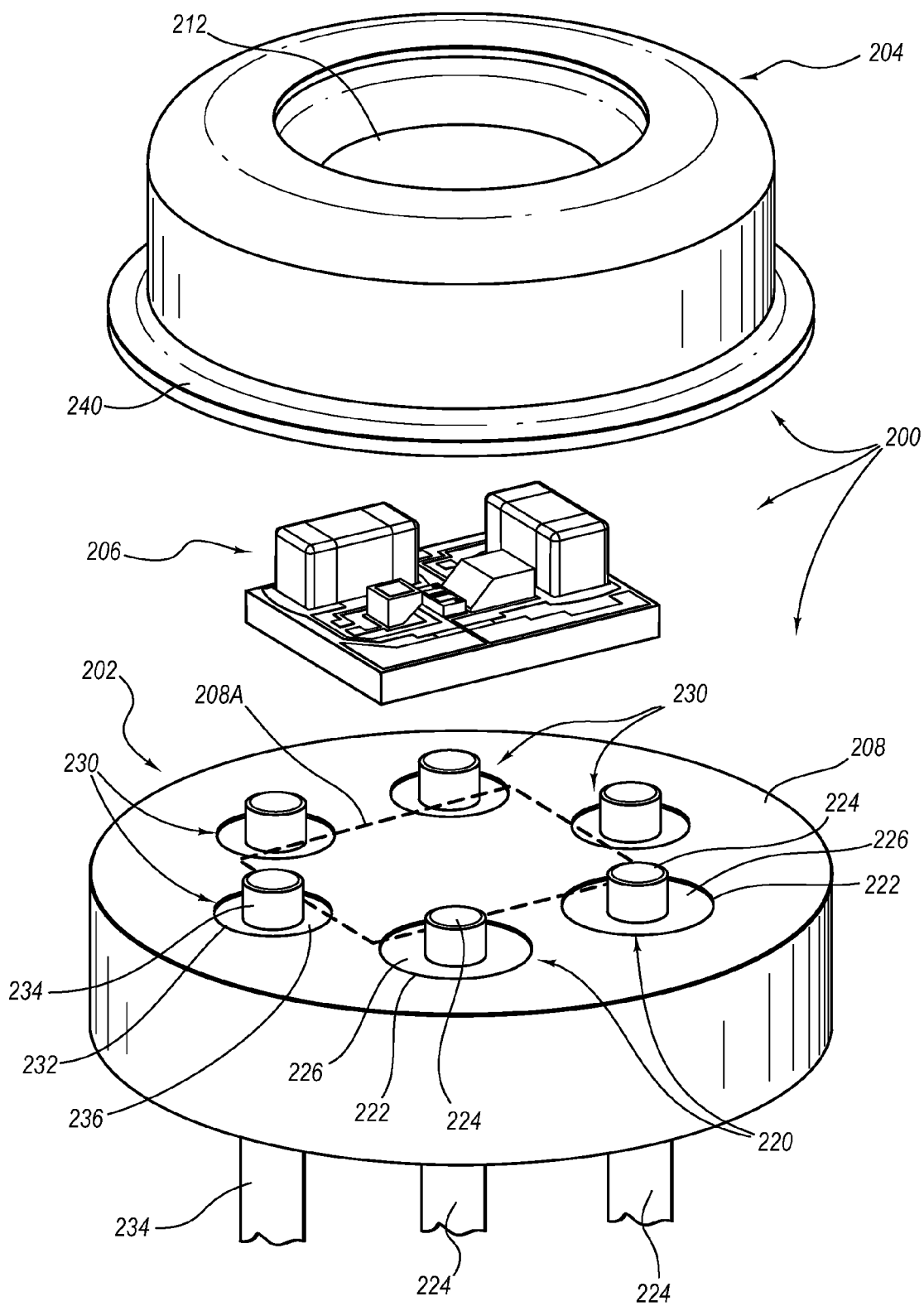
FIG. 2 is an exploded perspective view of a TO package configured in accordance with one embodiment.
Figure 3:
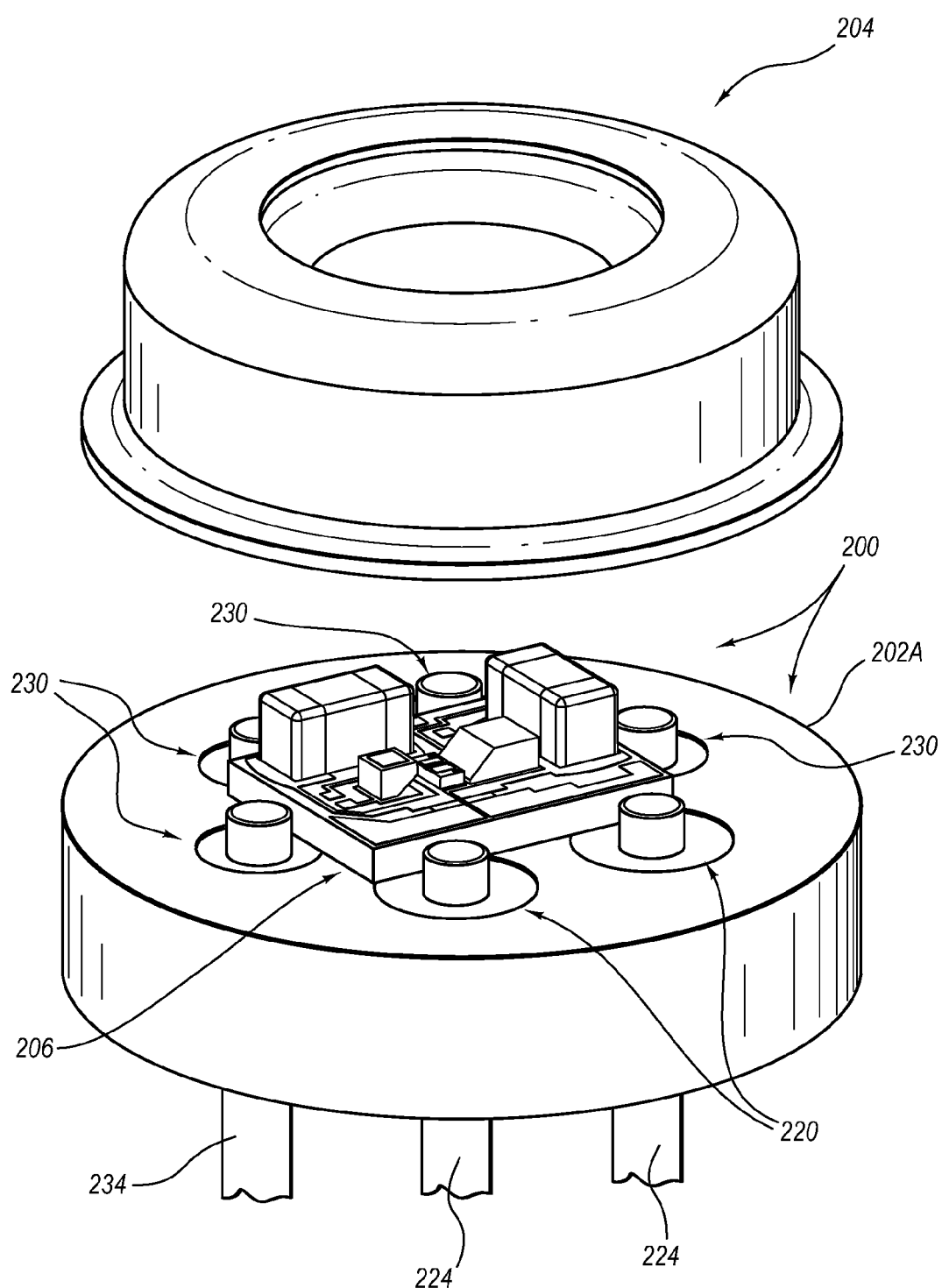
FIG. 3 is another exploded perspective view of the TO package of FIG. 2.
Figure 4:
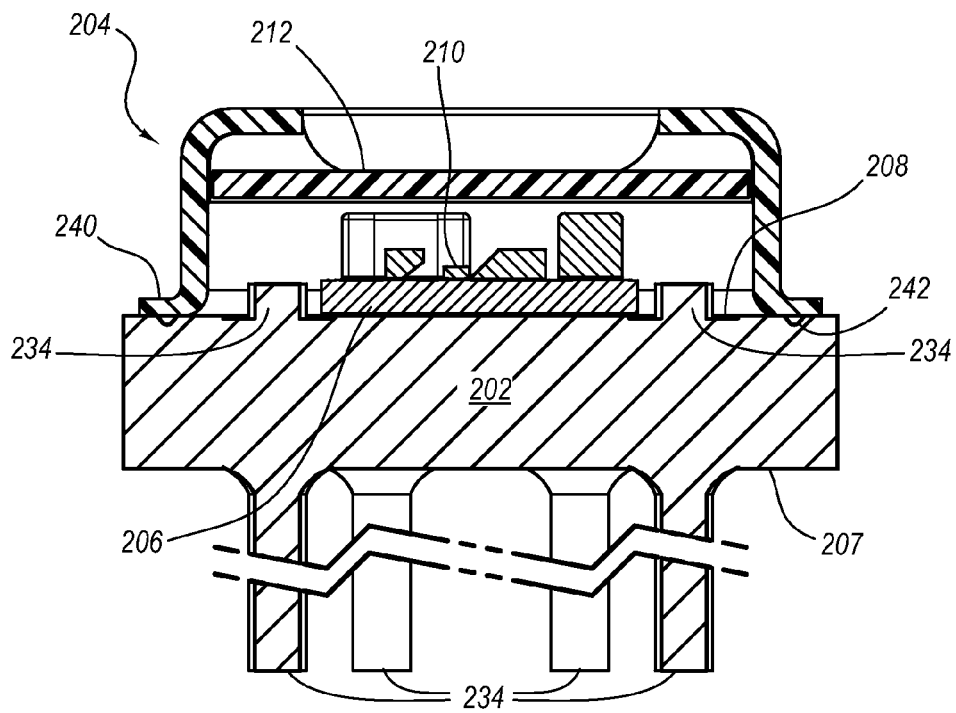
FIG. 4 is a cross sectional view of the TO package of FIG. 2 in an assembled state.

Reference is now made to FIGS. 2-4 in describing various details regarding one embodiment of the present invention. As an optical transmitter, the TOSA 10 shown in FIG. 1 includes a TO package that contains a laser diode for producing an optical signal during transceiver operation. An exploded view of the TO Package of the TOSA 10, generally designated at 200, is shown in FIG. 2, and additional views are included in FIGS. 3 and 4. Again, though described here in the context of its use within an optical transmitter such as a TOSA, the TO package to be described can also be modified for use within an optical receiver, such as the ROSA 20 shown in FIG. 1.

As shown, the TO package 200 generally includes a header 202 defining a substantially circular outer perimeter 202A, a can 204, and a submount 206 including various optoelectronic components thereon. The header 202 includes an exterior surface 207 and an interior surface 208 bounded by the outer perimeter 202A that includes an area for attaching the submount 206 thereto. FIG. 2 shows the submount 206 before attachment to the header interior surface 208, while FIG. 3 shows the submount after interior surface attachment.

The can 204 is configured to attach to a portion of the header interior surface 208 in a manner to be described below so as to hermetically seal the submount 206 within a volume defined by the interior of the can. FIG. 4 best shows the interior hermetic environment produced by sealing the can 204 to the header 202, as well as the placement of the submount 206 within that environment. A laser diode 210, as one exemplary optoelectronic component, is shown positioned on the submount 206 on the header interior surface 208. During operation of the transceiver 100, the laser diode 210 produces an optical signal for launching onto an optical fiber (not shown). The optical signal produced by the laser diode 210 is emitted through a transmissive window 212 defined in a top surface of the can 204.

FIG. 3 further illustrates two lead assemblies, namely, a high speed lead assembly ("HS assembly") 220 and a low speed lead assembly ("LS assembly") 230. The LS and HS assemblies 220 and 230 are employed to enable passage of electrical signals between the exterior of the header 202 and the various components mounted on the submount 206 positioned in the interior sealed volume defined by the cap 204 after attachment to the header.

In greater detail, the HS assembly 220 includes two feedthroughs, or vias 222, which are cylindrically defined through the header 202 so as to extend from the exterior surface 207 to the interior surface 208 thereof. Two leads 224 extend through the vias 222, each having one end that terminates proximate the interior surface 208 of the header 202 and an opposite end extending beyond the exterior header surface 207. A glass seal 226 is included in each via 222 so as to seal and insulate each lead 224 within its corresponding via.

Correspondingly, the LS assembly 230 includes four feedthroughs, or vias 232, which are cylindrically defined through the header 202 so as to extend from the exterior surface 207 to the interior surface 208 thereof. Four leads 234 extend through the vias 232, each having one end that terminates proximate the interior surface 208 of the header 202 and an opposite end extending beyond the exterior header surface 207. A glass seal 236 is included in each via 232 so as to seal and insulate each lead 234 within its corresponding via.

Comparison of FIGS. 2 and 3 demonstrate that the submount 206 is positioned between the leads 224 and 234 on an inner mounting surface 208A of the interior surface 208. In a manner to be further described below, the optoelectronic and various other components of the submount 206 electrically connect with one or more of the leads 224, 234 of the HS and LS assemblies 220 and 230, respectively, once the submount 206 has been properly attached to the inner mounting surface 208A. As will be described, maximization of the areal size of the inner mounting surface 208A is advantageous as this allows for relatively larger submounts to be attached between the leads on the header interior surface. Embodiments of the present invention are designed to enable such maximization of submount size, as is discussed further below.

FIG. 4 shows that the can 204 includes a flange 240 that serves as the portion of the can that physically attaches to the interior surface 208 of the header 202. The attachment surface of the flange 240 includes an annular extended surface 242 in the form of a pointed ring. This extended surface assists in concentrating the electric current in this region when the can 204 is welded or similarly attached to the header 202.

Figure 5:
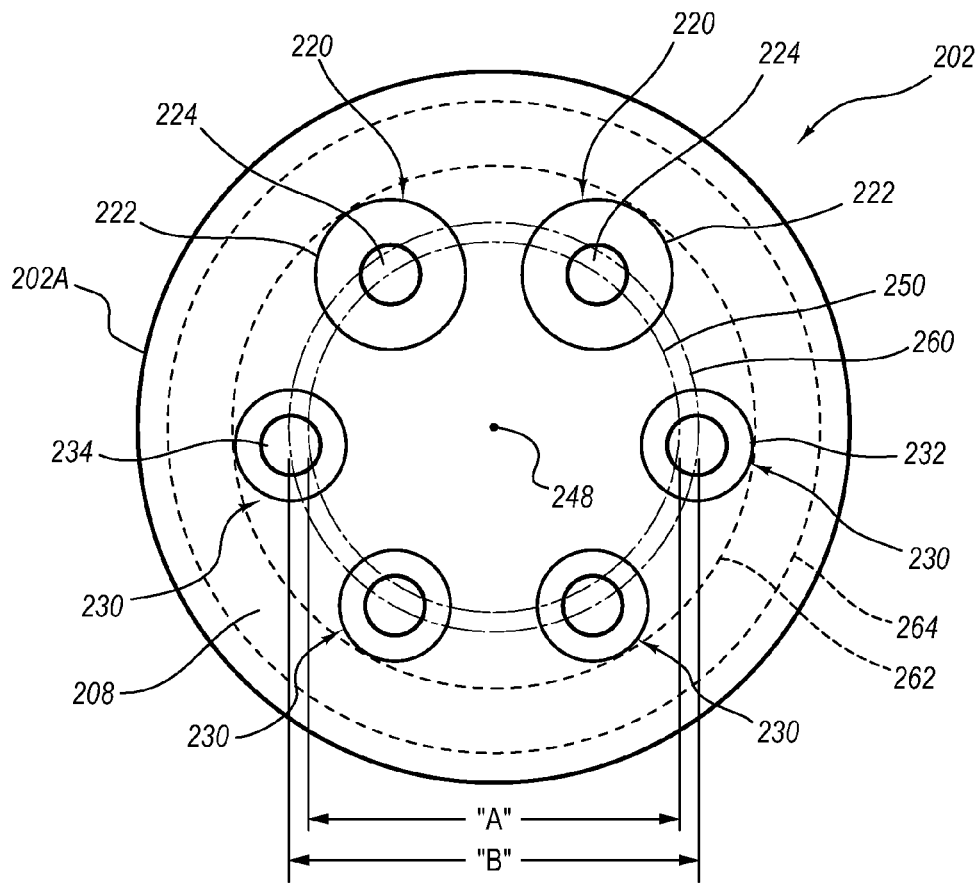
FIG. 5 is a top view of a header of the TO package of FIG. 2, showing the feedthrough and lead configuration thereof in accordance with one embodiment.

Reference is now made to FIG. 5 in describing further details regarding the HS and LS assemblies 220 and 230. As seen from this top view of the header interior surface 208 with the can 204 and submount 206 removed, the via/lead pairs 222/224 and 232/234 are arranged in a circular pattern. Note also that each of the two vias 222 of the HS assembly 220 has a first diameter that is greater than the second diameter of each of the four vias 232 of the LS assembly 230. Notwithstanding the relative difference in their diameters, the vias 222 and 232 are arranged such that an outermost portion of each circular via is equidistant from the header outer perimeter 202A, as evidenced by the tangential contact of the outermost portion each via with a tangent circle 262 imaginarily defined on the header interior surface 208, wherein the tangent circle 262 defines a set of points that are equidistant from the header outer perimeter 202A.

Note that the leads 224 of the HS assembly 220 and the leads 234 of the LS assembly 230 are centrally positioned in their respective vias 222 or 232. Note also that the positioning of the vias tangentially along the tangent circle 262 results from a difference in placement of the vias 222 of the HS assembly 220 with respect to the vias 234 of the LS assembly 230. In particular, FIG. 5 shows that the two HS vias 222, and thus the leads 224 centrally located therein, are positioned along an imaginary circle of a predetermined diameter centered about a center point 248 of the header 202, referred to herein as a "pin circle" 250 having a diameter "A" as shown in FIG. 5. In contrast, the four LS vias 232, and thus the leads 234 centrally located therein, are positioned along a pin circle 260 having a diameter "B." Note that, because the leads 224 and 234 are centrally located within their respective vias, the pin circles 250 and 260 ideally pass through the center of the respective leads positioned along that pin circle. In other embodiments it is possible to position the leads in the vias in a location other than the center of the via.

Inspection of FIG. 5 will reveal that the pin circle 260 has a relatively larger diameter than the pin circle 250. In prior known designs, each of the leads of the header were arranged on the same pin circle. In the present design, however, the vias 232/leads 234 of the LS assembly 230 are positioned along the relatively larger pin circle 260. Thus, given their relatively smaller diameter, the LS vias 232 can be placed relatively further toward the outer perimeter 202A of the header 202 than in past designs. Because of their relatively larger size, in contrast, the HS vias 222 remain positioned along the relatively smaller pin circle 250.

The above pin circle/via placement provides two results. First, the outer edge of both the HS vias 222 and LS vias 232 are arranged so as to tangentially contact the tangent circle 262, as described above, thereby placing the outer edge of each via equidistant from the header outer perimeter 202A. More importantly, this arrangement places each of the vias a safe distance away from the location where welding of the can 204 to the header interior surface 208 occurs. This annular welding location is designated at 264 in FIG. 5. Placement of the vias 222 and 232 at a safe distance ensures that damage to the glass seals 226 and 236 of the vias caused by heat from the can welding process does not occur.

Second, placement of the four LS vias 232/leads 234 on the relatively larger pin circle 260 enlarges the amount of usable area that defines the inner mounting surface 208A. Advantageously, this enables a relatively larger submount 206 to be placed in between the lead circle than what would otherwise be possible, which in turn frees up space for the placement and/or configuration of the components to be attached to the submount 206.

In the embodiment shown in FIG. 5, each via 222 of the HS assembly has a diameter of approximately 1.17 mm while each of the four LS assembly vias 232 has a diameter of about 0.9 mm. The pin circle 250 for the HS vias 222/leads 224 is about 3.2 mm in diameter, while the pin circle 260 for the LS vias 232/leads 234 has a diameter of about 2.9 mm. The diameter of the leads shown in FIG. 5 is approximately 0.45 mm.

Figure 6:
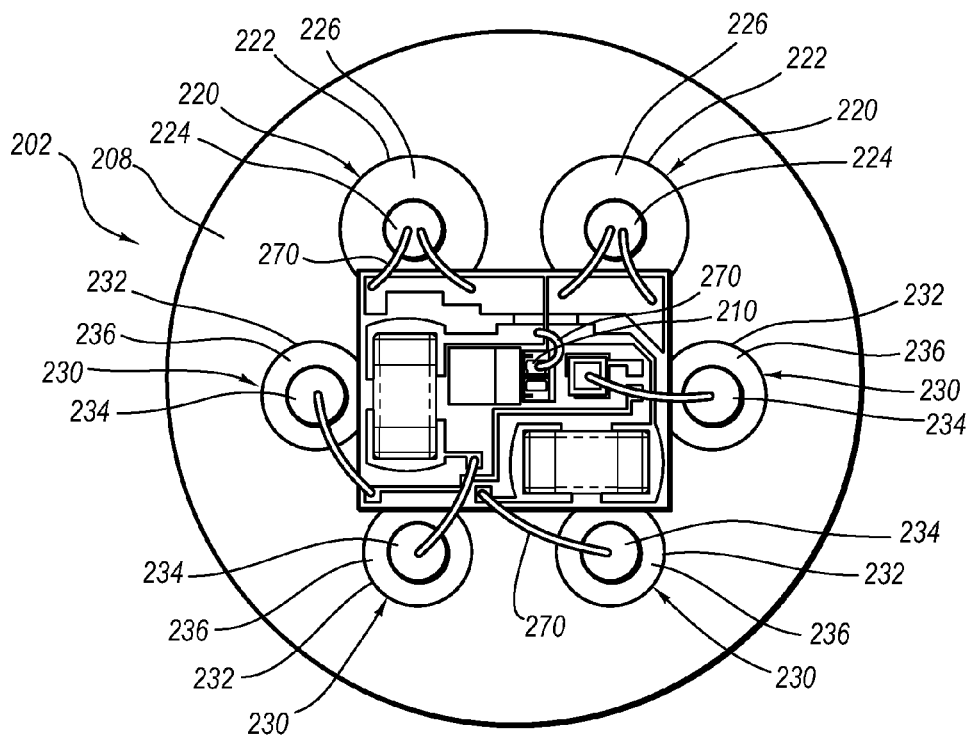
FIG. 6 is a top view of the TO package header of FIG. 5, having the submount attached thereto.

FIG. 6 shows a top view of the header 202 of FIG. 5 with the submount 206 attached. Also shown are a plurality of wirebonds 270 used to electrically connect the various optoelectronic and other components of the submount 206 to one or more of the various leads 224/234 of the header 202. Note that, as a result of the relative increase in size of the inner mounting surface 208A (FIG. 2) occasioned by the relatively larger diameter of the pin circle 260 for the leads 234, a submount larger than what would otherwise be possible is able to be positioned on the header interior surface 208, as shown in FIG. 6.

Figure 7:
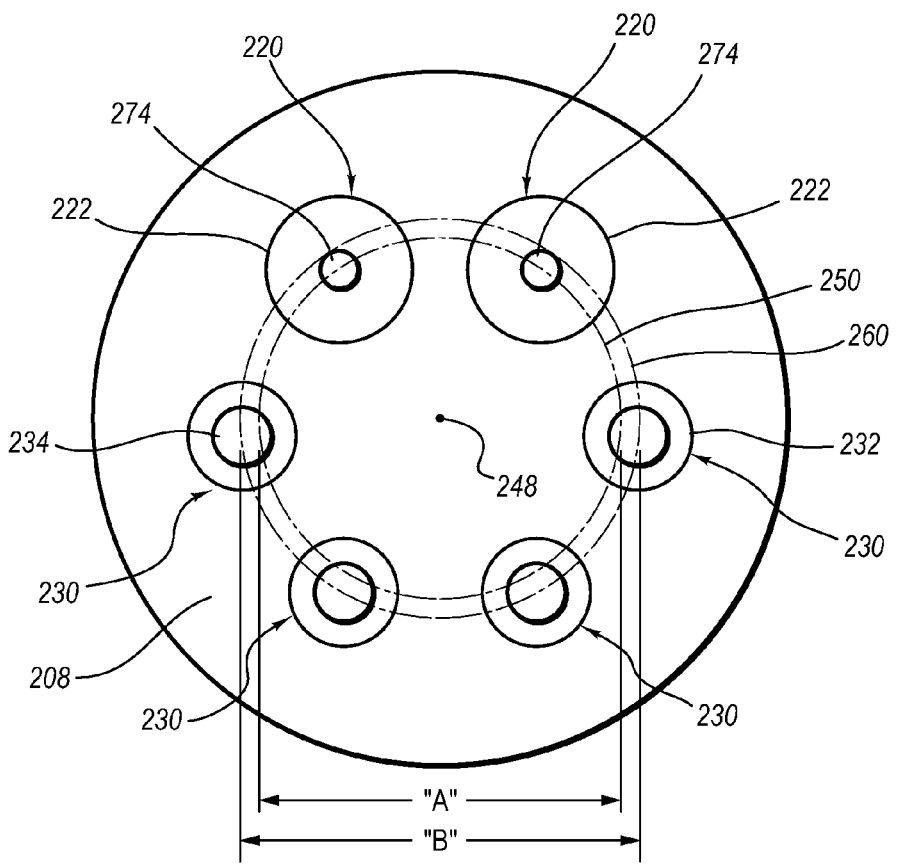
FIG. 7 is a top view of a header of a TO package, showing a feedthrough and lead configuration thereof in accordance with another embodiment of the present invention.

Another possible embodiment is shown in FIG. 7, wherein the leads 224 of the HS assembly 220 are replaced by relatively smaller diameter leads 274 in the HS vias 222. The HS leads 224 shown in FIG. 5 are configured for a 25 ohm impedance design; in contrast, the HS leads 274 sown in FIG. 7 have a diameter of approximately 0.25 mm and are configured for a 50 ohm impedance design. Thus, it is seen that various parameters of the design of the present invention, including the particular dimensions of the various components—including the leads, vias, pin circles, etc.—can be altered while still conforming to the principles of the embodiments disclosed herein.

Various other modifications may be made to the present invention while still residing the scope of its claims as contained herein. For instance, though the leads are arranged circularly on the header, the header need not be circular itself. Also, though designated as high speed and low speed herein, the leads of the header can serve other purposes and carry electrical signals of other types and speeds than what is described here. The two high speed leads shown in FIG. 6 are adjacent one another, but in an other embodiment one or both of their positions could move with respect to one another to the other possible lead locations, if desired. Also, though six total leads are employed in this design, more or fewer leads than this could alternatively be included on the header. Finally, leads positioned on more than two pin circles can also be included on the header.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A header assembly for use in an optoelectronic package, comprising:
    a header having an interior surface and an exterior surface formed opposite to the interior surface, the header including:
    a first lead assembly having:
    a plurality of first vias each defined through the header so as to extend from the interior surface to the exterior surface, each of the first vias having a first diameter, each first via being centered on a first pin circle on the interior surface of the header, the first pin circle having a first diameter;
    a plurality of first leads, each first lead received by a respective one of the first vias; and
    a second lead assembly having:
    a plurality of second vias each defined through the header so as to extend from the interior surface to the exterior surface, each of the second vias having a second diameter, each second via being centered on a second pin circle on the interior surface of the header, the second pin circle having a second diameter that is greater than the first diameter of the first pin circle; and
    a plurality of second leads, each second lead received by a respective one of the second vias.

2. The header assembly as defined in claim 1, further comprising a submount that is positioned on the interior surface of the header at least partially within the first and second pin circles.

3. The header assembly as defined in claim 1, wherein the first and second vias are arranged in a circular pattern.

4. The header assembly as defined in claim 1, wherein the first lead assembly includes two leads, and wherein the second lead assembly includes four leads.

5. The header assembly as defined in claim 1, wherein the first leads of the first lead assembly are high speed lines, and wherein the second leads of the second lead assembly are low speed lines.

6. The header assembly as defined in claim 1, wherein the first and second pin circles are centered about a center of the interior surface.

7. The header assembly as defined in claim 1, wherein the first diameter of the first vias is greater than the second diameter of the second vias.

8. An optical transceiver module, comprising:
    a housing;
    a receiver optical subassembly positioned in the housing; and
    a transmitter optical subassembly also positioned in the housing and including a transistor outline package, the transistor outline package including:
    a header defining a substantially circular outer perimeter and including an interior surface on which a submount is positioned and an exterior surface formed opposite to the interior surface;
    a first lead assembly having:
    a plurality of first vias each defined through the header so as to extend from the interior surface to the exterior surface, each of the first vias spaced a first distance from the header outer perimeter, each of the first vias having a first diameter; and a plurality of first leads, each first lead centrally positioned in a respective one of the first vias;

a second lead assembly having:

a plurality of second vias each defined through the header so as to extend from the interior surface to the exterior surface, each of the second vias spaced the first distance from the header outer perimeter, each of the second vias having a second diameter that is less than the first diameter of the first vias; and a plurality of second leads, each second lead centrally positioned in a respective one of the second vias.

9. The optical transceiver module as defined in claim 8, wherein each of the first leads is positioned along a first pin circle of the interior surface of the header, the first pin circle having a first diameter; and wherein each of the second leads is positioned along a second pin circle of the interior surface of the header, the second pin circle having a second diameter that is greater than the first diameter of the first pin circle.

10. The optical transceiver module as defined in claim 8, wherein the first and second pin circles are imaginarily defined on the interior surface of the header.

11. The optical transceiver module as defined in claim 8, wherein each of the first and second vias is spaced a second distance from an annular welding point defined on the interior surface of the header.

12. The optical transceiver module as defined in claim 11, wherein the annular welding point defines a point of contact between the interior surface of the header and a can that attaches to the header, and wherein the first and second vias are sufficiently spaced away from the annular welding point so as to prevent damage to a plurality of glass seals disposed about a portion of each lead received by the respective via.

13. The optical transceiver module as defined in claim 8, wherein the diameter of each of the first leads is smaller than the diameter of each of the second leads, and wherein the first leads are configured to have an impedance of about 50 ohms.

14. A method of manufacturing a header assembly for use in an optoelectronic package, comprising:

providing a header having an interior surface so as to extend from the interior surface to the exterior surface;

producing a plurality of first vias in the header, each first via defined through the header so as to extend from the interior surface to the exterior surface, each of the first vias having a first diameter, each first via being centered on a first pin circle on the interior surface of the header, the first pin circle having a first diameter selected based on the first diameter of the first vias;

providing a plurality of first leads, each first lead being received by a respective one of the first vias;

producing a plurality of second vias, each second via defined through the header so as to extend from the interior surface to the exterior surface, each of the second vias having a second diameter, each second via being centered on a second pin circle on the interior surface of the header, the second pin circle having a second diameter that is greater than the first diameter of the first pin circle and selected based on the second diameter of the second vias; and providing a plurality of second leads, each second lead being received by a respective one of the second vias.

15. The method of claim 14, further comprising selecting a submount and mounting the submount to the inner surface, wherein the size of the submount is selected based on the placement of the first and second vias.

16. The method of claim 15, wherein the size of the submount is greater than that that would be used where the first and second vias are disposed around the same pin circle.

17. The method of claim 14, wherein an outer edge of the first and second vias are arranged to tangentially contact a tangent circle thereby placing the outer edge of the first and second vias equidistant from an header outer perimeter.

18. The method of claim 17, further comprising welding a can to the header, wherein the equidistance of the first and second vias is selected to prevent damage to the first and second vias by the welding process while maximizing the amount of usable area that defines an inner mounting surface for a submount.

* * * * *